US010635764B2

(12) United States Patent
Qin et al.

(10) Patent No.: US 10,635,764 B2
(45) Date of Patent: Apr. 28, 2020

(54) METHOD AND DEVICE FOR PROVIDING VEHICLE NAVIGATION SIMULATION ENVIRONMENT

(71) Applicant: DiDi Research America, LLC, Mountain View, CA (US)

(72) Inventors: Zhiwei Qin, San Jose, CA (US); Ishan Jindal, Detroit, MI (US); Xuewen Chen, Mountain View, CA (US)

(73) Assignee: DiDi Research America, LLC, Mountain View, CA (US)

( * ) Notice: Subject to any disclaimer, the term of this patent is extended or adjusted under 35 U.S.C. 154(b) by 177 days.

(21) Appl. No.: 15/970,407

(22) Filed: May 3, 2018

(65) Prior Publication Data

US 2019/0340315 A1    Nov. 7, 2019

(51) Int. Cl.
*G06G 7/48* (2006.01)
*G06F 17/50* (2006.01)
*G06Q 30/02* (2012.01)

(52) U.S. Cl.
CPC ..... *G06F 17/5009* (2013.01); *G06Q 30/0208* (2013.01)

(58) Field of Classification Search
CPC .............. G06F 17/5009; G06Q 30/0208
USPC ............................................................. 703/8
See application file for complete search history.

(56) References Cited

U.S. PATENT DOCUMENTS

| 2011/0246404 | A1 | 10/2011 | Lehmann et al. |
| 2014/0062790 | A1 | 3/2014 | Letz et al. |
| 2014/0278052 | A1 | 9/2014 | Slavin et al. |
| 2016/0342946 | A1 | 11/2016 | Herraiz |
| 2016/0364823 | A1 | 12/2016 | Cao |
| 2017/0090478 | A1* | 3/2017 | Blayvas ............ G01C 21/3453 |
| 2019/0034794 | A1* | 1/2019 | Ogale ............... G01C 21/3407 |

OTHER PUBLICATIONS

G. Brockman, V. Cheung, L. Pettersson, J. Schneider, J. Schulman, J. Tang, and W. Zaremba. Openai gym, 2016.
B. Hengst. Hierarchical Reinforcement Learning, pp. 495-502. Springer US, Boston, MA, 2010.
(Continued)

*Primary Examiner* — Andre Pierre Louis
(74) *Attorney, Agent, or Firm* — Sheppard Mullin Richter & Hampton LLP

(57) ABSTRACT

A method for providing vehicle navigation simulation environment may comprise recursively performing steps (1)-(4) for a time period: (1) providing one or more states of a simulation environment to a simulated agent, wherein: the simulated agent comprises a simulated vehicle, and the states comprise a first current time and a first current location of the simulated vehicle; (2) obtaining an action by the simulated vehicle when the simulated vehicle has no passenger, wherein the action is selected from: waiting at the first current location of the simulated vehicle, and transporting M passenger groups; (3) determining a reward to the simulated vehicle for the action; and (4) updating the one or more states based on the action to obtain one or more updated states for providing to the simulated vehicle, wherein: the updated states comprise a second current time and a second current location of the simulated vehicle.

16 Claims, 10 Drawing Sheets

(56) References Cited

OTHER PUBLICATIONS

I. Jindal, Tony, Qin, X. Chen, M. Nokleby, and J. Ye. A Unified Neural Network Approach for Estimating Travel Time and Distance for a Taxi Trip. ArXiv e-prints, Oct. 2017.
Iglesias et al. "Data-Driven Model Predictive Control of Autonomous Mobility-on-Demand Systems", published Sep. 20, 2017. [retrieved on May 14, 2019] Retrieved from the Internet<URL: https://arxiv.org/pdf/1709.07032.pdf>, 7 pages.
PCT International Search Report and the Written Opinion dated May 8, 2019, issued in related International Application No. PCT/US2018/063834 (10 pages).

* cited by examiner

Algorithm 1 Wait Action

1: procedure
2:   *Given:* $\mathcal{D}, l_0, t_0, t_d, T = 600$ Sec., $T_c$
3:     $S_0 \leftarrow (l_0, t_0)$
4:     $S_1 \leftarrow (l_0, t_0 + t_d), r \leftarrow 0$

FIG. 3B

Algorithm 2 Take-1 Action

1: procedure
2:   *Given:* $\mathcal{D}, l_0, t_0, t_d, T = 600$ Sec., $T_c$
3:     $S_0 \leftarrow (l_0, t_0)$
4:     $\mathcal{D}' \leftarrow \mathcal{D}(t_0 \leq PickupTime(\mathcal{D}) \leq (t_0 + T))$
5:     $\mathcal{D}' \leftarrow \mathcal{D}'(t(D_0, O_1) \leq PickupTime(\mathcal{D}'))$
6:     if $\mathcal{D}' == \{\phi\}$ then
7:       $S_1 \leftarrow (l_0, t_0 + t_d), r \leftarrow 0$
8:     else
9:       $O_1 \leftarrow \arg\min_{PickupTime} \mathcal{D}'$
10:      $S_1 \leftarrow (l_{D_1}, t_{D_1}), r \leftarrow d(O_1, D_1)$

FIG. 3C

Algorithm 3 Take-2 Action

1: procedure
2: *Given:* $\mathcal{D}, l_0, t_0, t_d, T = 600$ Sec., $T_c$
3: $\quad S_0 \leftarrow (l_0, t_0)$
4: $\quad \mathcal{D}' \leftarrow \mathcal{D}(t_0 \leq PickupTime(\mathcal{D}) \leq (t_0 + T))$
5: $\quad \mathcal{D}' \leftarrow \mathcal{D}'(t(D_0, O_1) \leq PickupTime(\mathcal{D}'))$
6: $\quad$ if $\mathcal{D}' == \{\phi\}$ then
7: $\quad\quad S_1 \leftarrow (l_0, t_0 + t_d), r \leftarrow 0$
8: $\quad$ else
9: $\quad\quad O_1 \leftarrow \arg\min_{PickupTime} \mathcal{D}'$
10: $\quad\quad s_{O_1} \leftarrow (l_{O_1}, t_{O_1})$
11: $\quad\quad T_1 \leftarrow T_c * (t(O_1, D_1))$
12: $\quad\quad \mathcal{D} \leftarrow \mathcal{D}(t_{O_1} \leq PickupTime(\mathcal{D}) \leq (t_{O_1} + T_1))$
13: $\quad\quad \mathcal{D} \leftarrow \mathcal{D}(t_{O_1} + t(O_1, Origin(D)) \leq PickupTime(\mathcal{D}))$
14: $\quad\quad$ if $\mathcal{D} == \{\phi\}$ then
15: $\quad\quad\quad S_1 \leftarrow (l_0, t_0 + t_d), r \leftarrow 0$
16: $\quad\quad$ else
17: $\quad\quad\quad T_{Ext_I}, T_{Ext_{II}} \leftarrow ETT(\mathcal{D}, O_1, D_1)$     *// From Algorithm 4*
18: $\quad\quad\quad O_2 \leftarrow \arg\min(T_{Ext_I} + T_{Ext_{II}})$
19: $\quad\quad\quad s_{O_2} \leftarrow (l_{O_2}, t_{O_2})$
20: $\quad\quad\quad$ if $T_{Ext_I} < T_{Ext_{II}}$ then
21: $\quad\quad\quad\quad S_1 \leftarrow (l_{D_1}, t_{D_1})$
22: $\quad\quad\quad$ else
23: $\quad\quad\quad\quad S_1 \leftarrow (l_{D_2}, t_{D_2})$
24: $\quad\quad\quad r \leftarrow d(O_1, D_1) + d(O_2, D_2)$

FIG. 3D

Algorithm 4 *Extra Travel Time: ETT(D, $O_1, D_1$)*

1: procedure
2: $\forall O_2, D_2 \in \mathcal{D}$
3: $\quad \text{Ext}_I(O_1, D_1) \leftarrow t(O_1, O_2) + t_{\text{Ext}}(O_2, D_1) - t(O_1, D_1)$
4: $\quad \text{Ext}_I(O_2, D_2) \leftarrow t_{\text{Ext}}(O_2, D_1) + t_{\text{Ext}}(D_1, D_2) - t(O_2, D_2)$
5: $\quad \text{Ext}_{II}(O_1, D_1) \leftarrow t(O_1, O_2) + t(O_2, D_2) + t_{\text{Ext}}(O_2, D_1) - t(O_1, D_1)$
6: $\quad \text{Ext}_{II}(O_2, D_2) \leftarrow t(O_2, D_2) - t(O_2, D_2)$
7: $\quad \text{Total}_{\text{Ext}_I} \leftarrow \text{Ext}_I(O_1, D_1) + \text{Ext}_I(O_2, D_2)$
8: $\quad \text{Total}_{\text{Ext}_{II}} \leftarrow \text{Ext}_{II}(O_1, D_1) + \text{Ext}_{II}(O_2, D_2)$
   return $\text{Total}_{\text{Ext}_I}, \text{Total}_{\text{Ext}_{II}}$

FIG. 3E

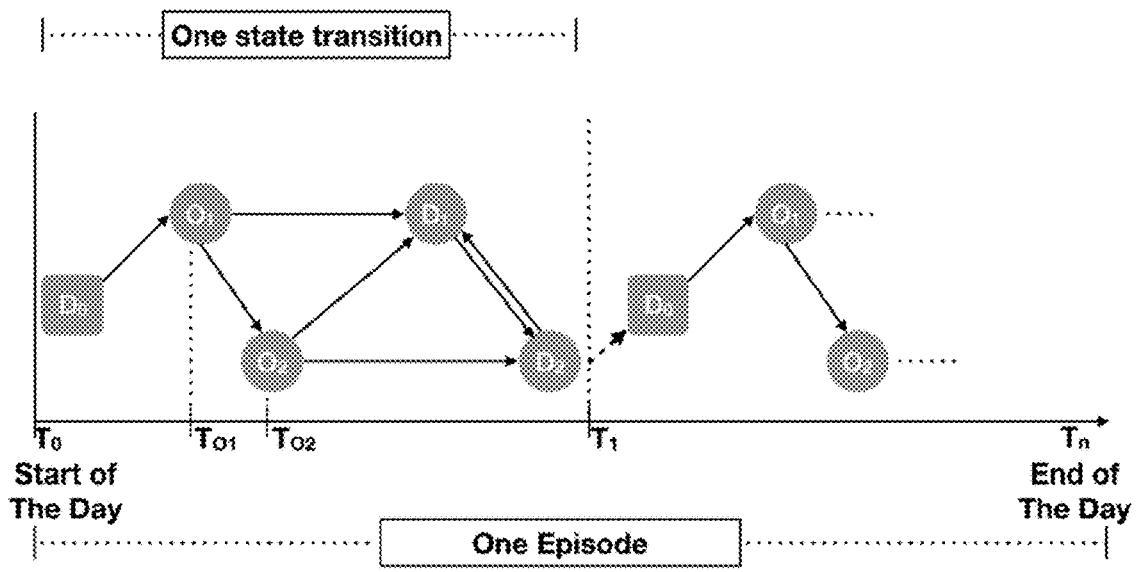

FIG. 3F $O_1$ is dropped first; Path I $O_2$ is dropped first; Path II

400

401: (1) providing one or more states of a simulation environment to a simulated agent, wherein: the simulated agent comprises a simulated vehicle, and the states comprise a first current time and a first current location of the simulated vehicle

402: (2) obtaining an action by the simulated vehicle when the simulated vehicle has no passenger, wherein: the action is selected from: waiting at the first current location of the simulated vehicle, and transporting M passenger groups, each of the M passenger groups comprises one or more passengers, and every two groups of the M passenger groups have at least one of: different pick-up locations or different drop-off locations

403: (3) determining a reward to the simulated vehicle for the action

404: (4) updating the one or more states based on the action to obtain one or more updated states for providing to the simulated vehicle, wherein: the updated states comprise a second current time and a second current location of the simulated vehicle

METHOD AND DEVICE FOR PROVIDING VEHICLE NAVIGATION SIMULATION ENVIRONMENT

FIELD OF THE INVENTION

This disclosure generally relates to methods and devices for providing vehicle navigation simulation environment and providing vehicle navigation.

BACKGROUND

A vehicle dispatch platform can automatically allocate transportation requests to corresponding vehicles for providing transportation services. The transportation service can include transporting a single passenger/passenger group or carpooling multiple passengers/passenger groups. Each vehicle driver provides and is rewarded for the transportation service provided. For the vehicle drivers, it is important to maximize their rewards for their time spent on the streets.

SUMMARY

Various embodiments of the present disclosure can include systems, methods, and non-transitory computer readable media configured to provide a vehicle navigation simulation environment. According to one aspect, an exemplary method for providing vehicle navigation simulation environment may comprise recursively performing steps (1)-(4) for a time period: (1) providing one or more states of a simulation environment to a simulated agent, wherein the simulated agent comprises a simulated vehicle, and the states comprise a first current time and a first current location of the simulated vehicle; (2) obtaining an action by the simulated vehicle when the simulated vehicle has no passenger, wherein the action is selected from: waiting at the first current location of the simulated vehicle, and transporting M passenger groups, wherein each of the M passenger groups comprises one or more passengers, and wherein every two groups of the M passenger groups have at least one of: different pick-up locations or different drop-off locations; (3) determining a reward to the simulated vehicle for the action; and (4) updating the one or more states based on the action to obtain one or more updated states for providing to the simulated vehicle, wherein the updated states comprise a second current time and a second current location of the simulated vehicle.

According to another aspect, the present disclosure provides a non-transitory computer-readable storage medium storing instructions that, when executed by one or more processors, cause the one or more processors to perform a method for providing vehicle navigation simulation environment. The method may comprise recursively performing the above-described steps (1)-(4) for a time period.

According to another aspect, the present disclosure provides a method for providing vehicle navigation. The method may comprise: determining a current number of real passengers onboard of a real vehicle; and in response to determining no real passenger onboard of the real vehicle, providing an instruction to transport M real passenger groups, based at least on a trained policy that maximizes a cumulative reward for the real vehicle. Each of the M passenger groups comprises one or more passengers. Every two groups of the M passenger groups have at least one of: different pick-up locations or different drop-off locations. The real vehicle is at a first current location. For M=0, the instruction comprises waiting at the first current location. For M=1, the instruction comprises transporting passenger group R. For M=2, the instruction comprises transporting passenger groups R and S in carpool. The passenger group R's pick-up location takes the least time to reach from the first current location. Transporting the passenger groups R and S in carpool is associated with a least sum value of: a total extra passenger travel time for (routing option 1) and a total extra passenger travel time for (routing option 2). The (routing option 1) comprises picking up the passenger group S, then dropping of the passenger group R, and then dropping of the passenger group S. The (routing option 2) comprises picking up the passenger group S, then dropping of the passenger group S, and then dropping of the passenger group R. The total extra passenger travel time for the (routing option 1) is a summation of extra time costing the passenger groups R and S when transported by the real vehicle following the (routing option 1) as compared to being transported group-by-group without carpool. The total extra passenger travel time for the (routing option 2) is a summation of extra time costing the passenger groups R and S when transported by the real vehicle following the (routing option 2) as compared to being transported group-by-group without carpool.

These and other features of the systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

FIGS. 3B-3E illustrate exemplary algorithms for providing vehicle navigation simulation environment, in accordance with various embodiments.

FIG. 3F illustrates an exemplary state transition for providing vehicle navigation simulation environment, in accordance with various embodiments.

FIG. 4A illustrates a flowchart of an exemplary method for providing vehicle navigation simulation environment, in accordance with various embodiments.

DETAILED DESCRIPTION

Vehicle platforms may be provided for transportation services. Such vehicle platform may also be referred to as a vehicle hailing or vehicle dispatching platform, accessible through devices such as mobile phones installed with a platform application. Via the application, users (transportation requestors) can transmit transportation requests (e.g., a pick-up location, a destination) to the vehicle platform. The vehicle platform may relay the requests to vehicle drivers. Sometimes, two or more passengers/passenger groups may request for carpool service. The vehicle drivers can choose from the requests to accept, pick up and drop off the passengers according to the accepted requests, and be rewarded accordingly.

Existing platforms merely provide basic information of current transportation requests, by which drivers are unable to determine a best strategy (e.g., who to pick up for, whether to accept carpool) for maximizing their earnings. Or if the platform automatically matches vehicles with service requestors, the matching is only based on simple conditions such as closest in distance. Further, with current technologies, drivers are neither able to determine the best route when carpooling passengers. Therefore, to help drivers maximize their earnings and/or help passengers minimize their trip time, it is important for the vehicle platform to provide automatic decision-making functions that can revamp the vehicle service.

Various embodiments of the present disclosure include systems, methods, and non-transitory computer readable media configured to provide vehicle navigation simulation environment, as well as systems, methods, and non-transitory computer readable media configured to provide vehicle navigation. The provided vehicle navigation simulation environment may comprise a simulator for training a policy that helps maximize vehicle driver rewards and/or minimize passenger trip time. The provided vehicle navigation may be based on the trained policy to guide real vehicle drivers in real situations.

The disclosed systems and methods provide algorithms for constructing a vehicle navigation environment (also referred to as a simulator) for training an algorithm or a model based on historical data (e.g., various historical trips and rewards with respect to time and location). From the training, the algorithm or the model may provide a trained policy. The trained policy may maximize the reward to the vehicle driver, minimize the time cost to the passengers, maximize the efficiency of the vehicle platform, maximize the efficiency of the vehicle service, and/or optimize other parameters according to the training. The trained policy can be deployed on servers for the platform and/or on computing devices used by the drivers.

Figure 1:
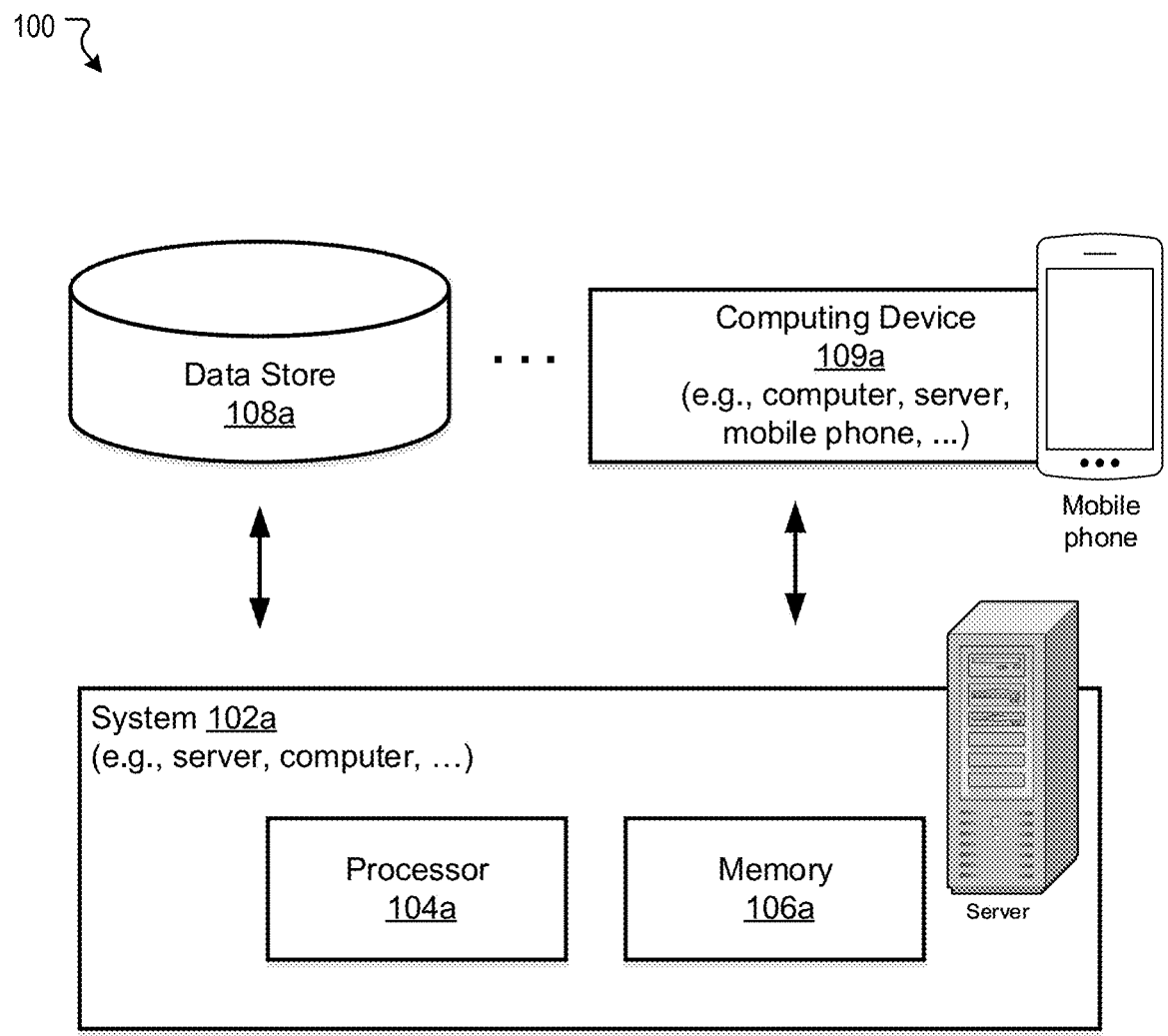
FIG. 1 illustrates an exemplary environment for providing vehicle navigation simulation environment, in accordance with various embodiments.

FIG. 1 illustrates an exemplary environment 100 for providing vehicle navigation simulation environment, in accordance with various embodiments. As shown in FIG. 1, the example environment 100 can comprise at least one computing system 102a that includes one or more processors 104a and memory 106a. The processor 104a may comprise a CPU (central processing unit), a GPU (graphics processing unit), and/or an alternative processor or integrated circuit. The memory 106a may be non-transitory and computer-readable. The memory 106a may store instructions that, when executed by the one or more processors 104a, cause the one or more processors 104a to perform various operations described herein. The system 102a may be implemented on or as various devices such as server, computer, etc. The system 102a may be installed with appropriate software and/or hardware (e.g., wires, wireless connections, etc.) to access other devices of the environment 100. In some embodiments, the vehicle navigation environment/simulator disclosed herein may be stored in the memory 106a as algorithms.

The environment 100 may include one or more data stores (e.g., data store 108a) and one or more computing devices (e.g., computing device 109a) that are accessible to the system 102a. In some embodiments, the system 102a may be configured to obtain data (e.g., historical trip data) from the data store 108a (e.g., database or dataset of historical transportation trips) and/or the computing device 109a (e.g., computer, server, mobile phone used by driver or passenger that captures transportation trip information such as time, location, and fees). The system 102a may use the obtained data to train an algorithm or a model for vehicle navigation. The location may comprise GPS (Global Positioning System) coordinates of a vehicle.

Figure 2:
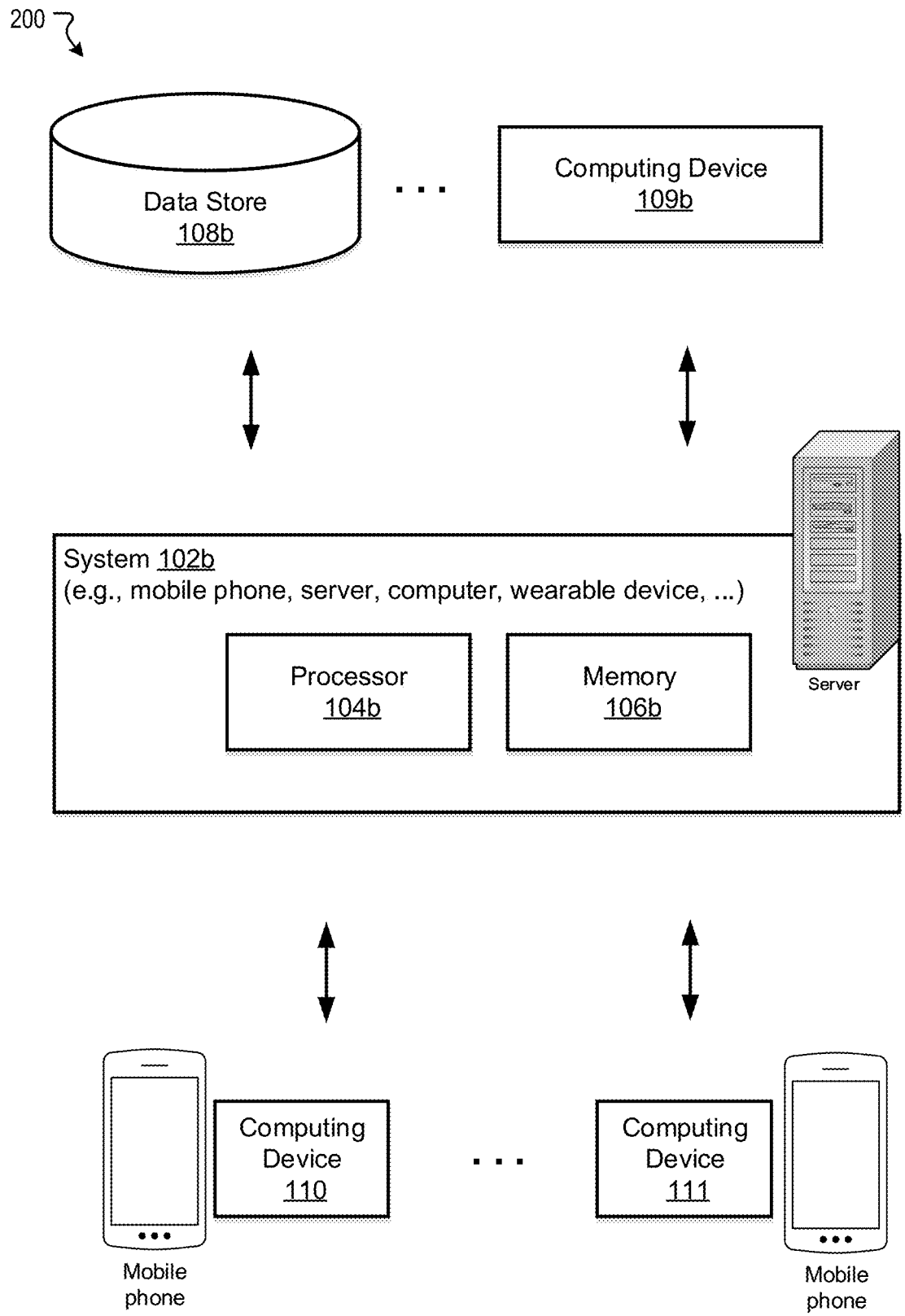
FIG. 2 illustrates an exemplary environment for providing vehicle navigation, in accordance with various embodiments.

FIG. 2 illustrates an exemplary environment 200 for providing vehicle navigation, in accordance with various embodiments. FIG. 2 illustrates an exemplary environment 200 for providing vehicle navigation simulation environment, in accordance with various embodiments. As shown in FIG. 2, the example environment 200 can comprise at least one computing system 102b that includes one or more processors 104b and memory 106b. The memory 106b may be non-transitory and computer-readable. The memory 106b may store instructions that, when executed by the one or more processors 104b, cause the one or more processors 104b to perform various operations described herein. The system 102b may be implemented on or as various devices such as mobile phone, server, computer, wearable device (smart watch), etc. The system 102b may be installed with appropriate software and/or hardware (e.g., wires, wireless connections, etc.) to access other devices of the environment 200.

The systems 102a and 102b may correspond to the same system or different systems. The processors 104a and 104b may correspond to the same processor or different processors. The memories 106a and 106b may correspond to the same memory or different memories. The data stores 108a and 108b may correspond to the same data store or different data stores. The computing devices 109a and 109b may correspond to the same computing device or different computing devices.

The environment 200 may include one or more data stores (e.g., a data store 108b) and one or more computing devices (e.g., a computing device 109b) that are accessible to the system 102b. In some embodiments, the system 102b may be configured to obtain data (e.g., map, location, current time, weather, traffic, driver information, user information, vehicle information, transaction information, etc.) from the data store 108b and/or the computing device 109b. The location may comprise GPS coordinates of a vehicle.

Although shown as single components in this figure, it is appreciated that the system 102b, the data store 108b, and the computing device 109b can be implemented as single devices or multiple devices coupled together, or two or more of them can be integrated together. The system 102b may be implemented as a single system or multiple systems coupled to each other. In general, the system 102b, the computing device 109b, the data store 108b, and the computing device 110 and 111 may be able to communicate with one another through one or more wired or wireless networks (e.g., the Internet) through which data can be communicated.

In some embodiments, the system 102b may implement an online information or service platform. The service may be associated with vehicles (e.g., cars, bikes, boats, airplanes, etc.), and the platform may be referred to as a vehicle (service hailing or ride order dispatching) platform. The platform may accept requests for transportation, identify vehicles to fulfill the requests, arrange for pick-ups, and process transactions. For example, a user may use the computing device 111 (e.g., a mobile phone installed with a software application associated with the platform) to request transportation from the platform. The system 102b may receive the request and relay it to various vehicle drivers (e.g., by posting the request to mobile phones carried by the drivers). One of the vehicle drivers may use the computing device 110 (e.g., another mobile phone installed with the application associated with the platform) to accept the posted transportation request and obtain pick-up location information. Similarly, carpool requests from multiple passengers/passenger groups can be processed. Fees (e.g., transportation fees) can be transacted among the system 102b and the computing devices 110 and 111. The driver can be compensated for the transportation service provided. Some platform data may be stored in the memory 106b or retrievable from the data store 108b and/or the computing devices 109b, 110, and 111.

The environment 100 may further include one or more computing devices (e.g., computing devices 110 and 111) coupled to the system 102b. The computing devices 110 and 111 may comprise devices such as cellphone, tablet, computer, wearable device (smart watch), etc. The computing devices 110 and 111 may transmit or receive data to or from the system 102b.

Referring to FIG. 1 and FIG. 2, in various embodiments, the environment 100 may train a model to obtain an policy, and the environment 200 may implement the trained policy. For example, the system 102a may obtain data (e.g., training data) from the data store 108 and/or the computing device 109. The training data may comprise historical trips taken by passengers/passenger groups. Each historical trip may comprise information such as pick-up location, pick-up time, drop-off location, drop-off time, fee, etc. The obtained data may be stored in the memory 106a. The system 102a may train a model with the obtained data or train an algorithm with the obtained data to learn a model for vehicle navigation. In the latter example, the algorithm of learning a model without providing a state transition probability model and/or a value function model may be referred to as a model-free reinforcement learning (RL) algorithm. By simulation, the RL algorithm may be trained to provide a policy that can be implemented in real devices to help drivers make optimal decisions.

Figure 3A:
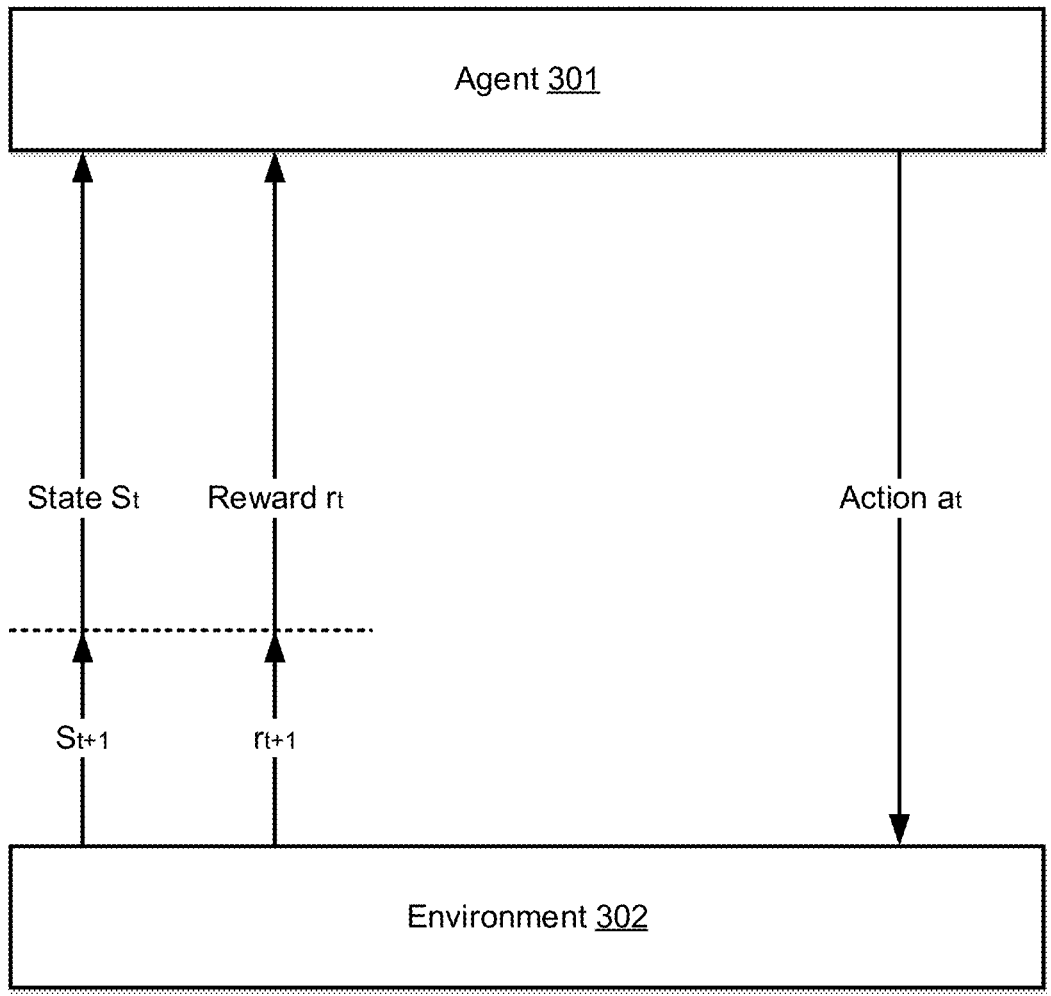
FIG. 3A illustrates an exemplary reinforcement learning framework, in accordance with various embodiments.
Figure 3A:
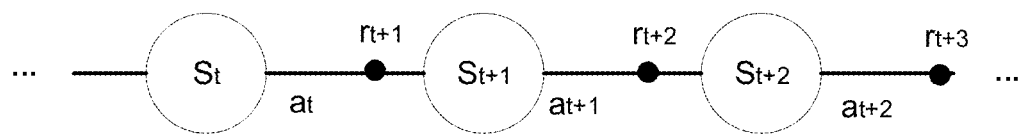

FIG. 3A illustrates an exemplary reinforcement learning framework, in accordance with various embodiments. As shown in this figure, for an exemplary RL algorithm, a software agent 301 takes actions in an "environment" 302 (or referred to as "simulator") to maximize a "reward" for the agent. The agent and environment interact in discrete time steps. In training, at time step t, the agent observes the state of the system (e.g., state $S_t$), produces an action (e.g., action $a_t$), and gets a resulting reward (e.g., reward $r_{t+1}$) and a resulting next state (e.g., state $S_{t+1}$). Correspondingly, at time step t, the environment provides one or more states (e.g., state $S_t$) to the agent, obtains the action taken by the agent (e.g., action at), advances the state (e.g., state $S_{t+1}$), and determines the reward (e.g., reward $r_{t+1}$). Relating to the vehicle service context, the training may be comparable with simulating a vehicle driver's decision as to waiting at the current position, picking up one passenger group, or carpooling two passenger groups (comparable to the agent's actions), with respect to time (comparable with the states), vehicle and customer location movements (comparable with the states), earnings (comparable with the reward), etc. Each passenger group may comprise one or more passengers.

Back to the simulation, to produce an optimal policy that governs the decision-making at each step, a corresponding state-action value function of the driver may be estimated. The value function can show how good a decision made at a particular location and time of the day with respect to the long-term objective (e.g., maximize earnings). At each step, with states provided by the environment, the agent executes an action (e.g., waiting, transporting one passenger group, two passenger groups, three passenger groups, etc.), and correspondingly from the environment, the agent receives a reward and updated states. That is, the agent chooses an action from a set of available actions, and the agent moves to a new state, and the reward associated with the transition is determined for the action. The transition may be recursively performed, and the goal of the agent is to collect as much reward as possible.

For the simulation, the RL algorithm builds on a Markov decision process (MDP). The MPD may depend on observable state space S, action space a, state transition probabilities, reward function r, starting state, and/or reward discount rate, some of which are described in details below. The state transition probabilities and/or reward function r may be known or unknown (referred to as model-free methods).

State, S: the states of a simulation environment may comprise location and/or time information. For example, the location information may comprise geo-coordinates of a simulated vehicle and time (e.g., time-of-day in seconds): S=(l, t), where l is the GPS coordinates pair (latitude, longitude), and t is time. S may contain additional features that characterize the spatio-temporal space (l, t).

Action, a: the action is assignment to the driver, the assignment may include: waiting at the current location, picking up a certain passenger/passenger group, picking up multiple passengers/passenger groups and transport them in carpool, etc. The assignment with respect to transportation may be defined by pick-up location(s), pick-up time point(s), drop-off location(s), and/or drop-off time point(s).

Reward, r: the reward may comprise various forms. For example, in simulation, the reward may be represented by a nominal number determined based on a distance. For example, in a single passenger trip, the reward may be determined based on a distance between a trip's origin and destination. For another example, in a two passenger carpooling trip, the reward may be determined based on a sum of: a first distance between the first passenger's origin and destination, and a second distance between the second passenger's origin and destination. In real life, the reward may relate to a total fee for the transportation, such as the compensation received by the driver for each transportation. The platform may determine such compensation based on a distance traveled or other parameters.

Episode: the episode may comprise any time period such as one complete day from 0:00 am to 23:59 pm. Accordingly, a terminal state is a state with t component corresponding to 23:59 pm. Alternatively, other episode definitions for a time period can be used.

Policy, π: a function that maps a state to a distribution over the action space (e.g., stochastic policy) or a particular action (e.g., deterministic policy).

In various embodiments, the trained policy from RL beats existing decision-making data and other inferior policies in terms of the cumulative reward. The simulation environment can be trained with historical data of trips taken by historical passenger groups, such as a data set of historical taxi trips within a given city. The historical data can be used to bootstrap sample passenger trip requests for the simulation. For example, given one month of trips data, a possible way of generating a full day of trips for a simulation run is to sample one-fourth of the trips from each hour on the given day-of-week over the month. For another example, it can be assumed that after a driver drops off a passenger at her destination, and from the vicinity of the destination, the driver would be assigned a new trip request. According to action searches and/or route determinations described below, the action of a simulated vehicle can be selected by the given policy, which may comprise fee-generating trips, wait actions, etc. The simulation can be run for multiple episodes (e.g., days), and the cumulative reward gained can be computed and averaged over the episodes.

Detailed algorithms for providing the environment are provided below with reference to FIGS. 3B-3G. The environment can support various modes. In a Reservation Mode, transportation request(s) from passenger(s) are known to the simulated vehicle in advance, and the carpooling decision (e.g., whether to carpool multiple passengers) is made at the time when the vehicle is vacant, that is, having no passengers. In agreement to the RL terminologies, the driver's (agent's) state which may comprise a (location, time) pair, the agent's action, and the reward collected after executing each action are tracked.

In some embodiments, an exemplary method for providing vehicle navigation simulation environment may comprise recursively performing steps (1)-(4) for a time period. The steps (1)-(4) may include: step (1) providing one or more states (e.g., the state S) of a simulation environment to a simulated agent, wherein the simulated agent comprises a simulated vehicle, and the states comprise a first current time (e.g., t) and a first current location (e.g., l) of the simulated vehicle; step (2) obtaining an action by the simulated vehicle when the simulated vehicle has no passenger, wherein the action is selected from: waiting at the first current location of the simulated vehicle, and transporting M passenger groups, wherein each of the M passenger groups comprises one or more passengers, and wherein every two groups of the M passenger groups have at least one of: different pick-up locations or different drop-off locations; step (3) determining a reward (e.g., the reward r) to the simulated vehicle for the action; and step (4) updating the one or more states based on the action to obtain one or more updated states for providing to the simulated vehicle, wherein the updated states comprise a second current time and a second current location of the simulated vehicle.

In some embodiments, the "passenger group" is to distinguish passengers that are picked up from different locations and/or dropped off at different locations. If passengers share the same pick-up and drop-off locations, they may belong to the same passenger group. Each passenger group may comprise just one passenger or multiple passengers. Further, the simulated vehicle may have a capacity for N passengers, and during at any time of the transportation, the number of total passengers on board may not exceed N. When referring to the passenger herein, the driver is not counted.

In some embodiments, obtaining the action by the simulated vehicle when the simulated vehicle has no passenger comprises obtaining the action by the simulated vehicle only when the simulated vehicle has no passenger; and the simulated vehicle performs the action for the each recursion.

In some embodiments, if the action in step (2) is transporting the M passenger groups, in the step (4) the second current time is a current time corresponding to having dropped off all of the M passenger groups and the second current location is a current location of the vehicle at the second current time.

In some embodiments, in the Reservation Mode, the action of taking M passenger groups (which include waiting at the current location when M=0) and the transportation assignment(s) are assigned to the simulated vehicle in sequence. The agent can learn a policy to cover only first-level actions (e.g., determining the number M for transporting M passenger groups, which includes waiting at the current location when M=0) or both the first-level actions and second-level actions (e.g., which second passenger group to pick up after picking up a first passenger group, which route to take when carpooling multiple passenger groups, etc.). In the first case, the learned policy makes the first-level decisions, whereas the secondary decisions can be determined by Algorithms 2 and 3. In the second case, the policy bears the responsibility in determining M as well as routing and planning of the carpooling trip. The various actions are described in details below with reference to respective algorithms. For the RL training, at the start of the episode, D0 is the initial state $S_0=(l_0, t_0)$ of the vehicle, whereas the actual origin of a vehicle transportation trip is $O_1$, and $S_{O1}=(l_{O1}, t_{O1})$ is the intermediate state of the vehicle when picking up the first passenger. Such representations and similar terms are used in the algorithms below.

FIG. 3B illustrates an exemplary Algorithm 1 for providing vehicle navigation simulation environment, in accordance with various embodiments. The operations shown in FIG. 3B and presented below are intended to be illustrative.

Algorithm 1 may correspond to a Wait Action (W). That is, M=0 and the simulated vehicle is assign to wait at its current location without picking up any passenger group. When the wait action is assigned to the vehicle at state $S_0=(l_0, t_0)$, the vehicle stays at the current location $l_0$ while the time to advances by $t_d$. Therefore, the next state of the driver would be $(l_0, t_0+t_d)$ as described in line 4 of Algorithm 1. That is, if the action at the step (2) is waiting at the current location of the simulated vehicle, the second current time is a current time corresponding to the first current time plus a time segment $t_d$, and the second current location is the same as the first current location.

FIG. 3C illustrates an exemplary Algorithm 2 for providing vehicle navigation simulation environment, in accordance with various embodiments. The operations shown in FIG. 3C and presented below are intended to be illustrative.

Algorithm 2 may correspond to a Take-1 Action (transporting 1 passenger group). That is, M=1. Given the initial state of $S_0$, a transportation trip is assigned to the simulated vehicle for which the vehicle can reach the origin $O_1$ of the transportation trip in a time less than the historical pick-up time of the passenger group. For example, referring to line 4 of Algorithm 2, a transportation request search area can be reduced by finding all historical transportation trips having pickup time in the range of to $t_0$ ($t_0+T$) irrespective of the origins of the historical trips, where T defines the search time window (e.g., 600 seconds). Referring to line 5 of Algorithm 2, the transportation trip search area can be further reduced by finding all historical vehicle trips where the simulated vehicle can reach before the historical pickup time from the simulated vehicle's initial state $S_0$. Here, $t(D_0, O_1)$ can represent the time for advancing from state $D_0$ to state $O_1$. Since the historical transportation data can represent when and where transportation demands arise, filtering the transportation request search by historical pick-up time in line 4 can obtain customer candidates matching a time window for potentially being picked up, while ignoring how far or close these customer candidates are. Additionally filtering the transportation request search by proximity to the location of the vehicle in line 5 can further narrow the group of potential customers who are mostly suitable to be picked up from reward maximization. Referring to lines 6-7 of Algorithm 2, if there is no such trip origin, similar to the Algorithm 1, the simulated vehicle continues waiting at its current location $l_0$ but the time advance to $(t_0+t_d)$ and the state of the vehicle becomes $S_1=(l_0, t_0+t_d)$. And the reward for the waiting action is 0. Whereas, referring to lines 9-10 of Algorithm 2, if there exist such historical vehicle trips, a historical vehicle trip with minimum pick-up time (the least time to reach its pick-up location) is assigned to the simulated vehicle. Finally, the simulated vehicle picks up the passenger group from the origin of assigned trip and drops the passenger group at the destination, and its state is updated to $S_1=(l_{D1}, t_{D1})$ upon completing the state transition. Here, $l_{D1}$ represents the drop-off location of the passenger group and $t_{D1}$ is the time of day when the simulated vehicle reaches the destination $D_1$.

Thus, in some embodiments, the method for providing vehicle navigation simulation environment may further comprise, based on historical data of trips taken by historical passenger groups: searching for one or more first historical passenger groups, wherein: (condition A) time points when the first historical passenger groups were respectively picked up from first pick-up locations are within a first time threshold from the first current time, and (condition B) time points for the simulated vehicle to reach the first pick-up locations from the first current location are respectively no later than historical time points when the first passenger groups were picked up; and in response to finding no first historical passenger group satisfying the (condition A) and (condition B), assigning the simulated vehicle to wait at the first current location, and correspondingly determining the reward for the current action to be zero.

In some embodiments, if M=1 and in response to finding one or more first historical passenger groups satisfying the (condition A) and (condition B), the method may further comprise assigning the simulated vehicle to transport passenger group P associated with a first pick-up location that takes the least time to reach from the first current location, and correspondingly determining the reward for the current action based on a travel distance by the passenger group P for the assigned transportation, wherein the passenger group P is one of the found first historical passenger groups.

FIG. 3D illustrates an exemplary Algorithm 3 for providing vehicle navigation simulation environment, in accordance with various embodiments. The operations shown in FIG. 3D and presented below are intended to be illustrative.

Algorithm 3 may correspond to a Take-2 Action (transporting 2 passenger groups in carpool). That is, M=2. Referring to lines 3-7 of Algorithm 3, given the initial state $S_0$, a first transportation task is assigned to the simulated vehicle similar to the Take-1 action. Once the first transportation task is assigned, the simulated vehicle reaches the origin location $O_1$ to pick up the first passenger group and its intermediate state is updated to $S_{O1}=(l_{O1}, t_{O1})$.

From the intermediate state $S_{O1}$, how a second transportation task is assigned to the simulated vehicle is described in lines 9-24 of Algorithm 3, where a second transportation task is assigned to the driver by following a similar procedure to assigning the first transportation task, and the state of the simulated vehicle is updated to $S_{O2}=(l_{O2}, t_{O2})$. Referring to line 12 of Algorithm 3, the difference from the Algorithm 2 is the transportation trip's pickup time search range. For the second transportation task, the trip search area is reduced by selecting all the historical transportation trips in pickup time range of $t_{O1}$ to $(t_{O1}+(T_c*t(O_1, D_1)))$ irrespective of the origin locations of the historical transportation trips. Here, $t(O_1, D_1)$ can represent the time for transporting the first passenger group alone from its origin to destination. The simulated vehicle may have to stay at the intermediate state $S_{O1}$ for up to $(T_c*t(O_1, D_1))$ seconds while the search for the second transportation request is being made. Here, $T_c$ is in the range of $(0, 1)$ and is an important parameter which controls the trip search area for the second transportation task assignment.

The second transportation task search area may not be fixed. For instance, assuming the size of search time window is fixed to T=600 s similar to first transportation task. The pick-up time search range for second transportation task becomes $(t_{O1}, t_{O1}+T)$. From the historical dataset, if a historical vehicle can complete the assigned trip for the first passenger group from $O_1$ to $D_1$ in $t(O_1, D_1)=500$ s<T, it is more efficient to assign Take-1 Action to the simulated vehicle rather than assigning Take-2 Action. Therefore, a dynamic pick-up time search range is needed for selecting the second transportation task. Referring to line 13 of Algorithm 3, after reducing the pick-up time search area for second transportation task, the search area can be further reduced by selecting all the historical transportation trips where simulated vehicle can reach before the historical pick-up time points toe from its intermediate state $S_{O1}$.

Thus, in some embodiments, the method for providing vehicle navigation simulation environment may further comprise: if M=2 and in response to finding the one or more first historical passenger groups satisfying the (condition A) and (condition B) described above, assigning the simulated vehicle to pick up passenger group P associated with a first pick-up location that takes the least time to reach from the first current location, wherein the passenger group P is one of the found first historical passenger groups; determining a time T for transporting the passenger group P from the first pick-up location to a destination of the passenger group P; searching for one or more second historical passenger groups, wherein: (condition C) time points when the second historical passenger groups were respectively picked up from second pick-up locations are within a second time threshold from time point when the passenger group P was picked up, the second time threshold being a portion of the determined time T, and (condition D) time points for the simulated vehicle to reach the second pick-up locations from the time when the passenger group P was picked up are respectively no later than historical time points when the second historical passenger groups were picked up; and in response to finding no second historical passenger group satisfying the (condition C) and (condition D), assigning the simulated vehicle to wait at the first pick-up location of the passenger group P.

Having determined the two passenger groups to transport for M=2, the simulated vehicle has picked up 1 first passenger group and determined choices for the second passenger group. (The first and second passenger groups have different destinations $D_1$ and $D_2$). Which second passenger group to choose and which of the first and second passenger groups to drop off first can be determined according to lines 17-24 of Algorithm 3. Referring to line 18 of Algorithm 3, a second passenger group corresponding to the minimum $(T_{ExtI}+T_{ExtII})$ can be chosen by the simulated vehicle under the current policy. $T_{ExtI}$ and $T_{ExtII}$ can be referred to Algorithm 4 described in FIG. 3E, which illustrates an exemplary Algorithm 4 for providing vehicle navigation simulation environment, in accordance with various embodiments.

In one example, the problems to solve here may be deterministic and this decision making can be lumped as a part of secondary decision making. Referring to FIG. 3F, FIG. 3F illustrates an exemplary state transition for providing vehicle navigation simulation environment, in accordance with various embodiments. The operations shown in FIG. 3F and presented below are intended to be illustrative. FIG. 3F shows an episode of one day within which multiple state transitions (corresponding to the recursions described above) can be performed. An exemplary state transition involving carpooling two passenger groups are provided. As described above, the simulated vehicle may start at state Do at $T_0$, moves to state $O_1$ at $T_{O1}$ to pick up a first passenger group, and then moves to state $O_2$ at Toe to pick up a second passenger group. After both passenger groups are dropped off, at $T_1$, the simulated vehicle may move onto a next state transition.

Figure 3G:
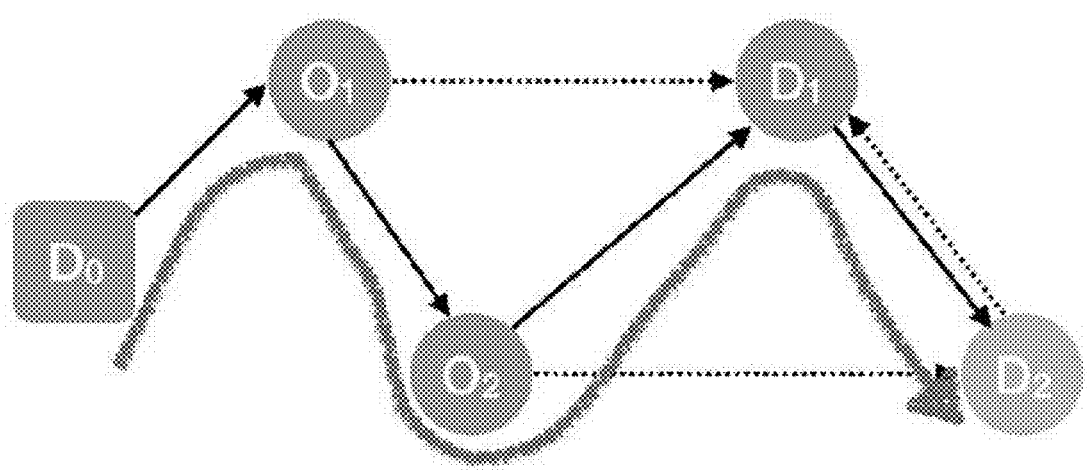
FIG. 3G illustrates exemplary routing options for carpooling, in accordance with various embodiments.
Figure 3G:
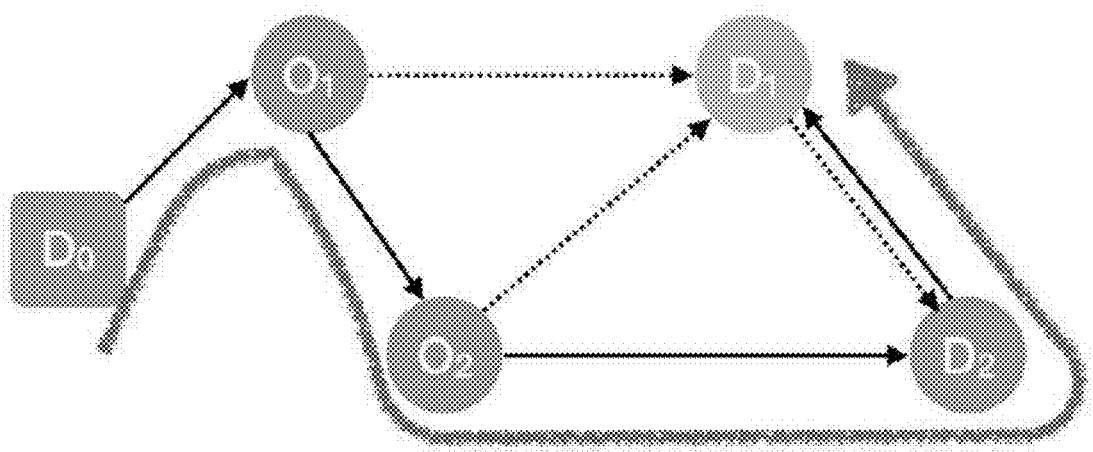

After the second passenger group has been picked up, the simulated vehicle has options to drop off the first or second passenger group. FIG. 3G illustrates exemplary routing options for carpooling, in accordance with various embodiments. The operations shown in FIG. 3G and presented below are intended to be illustrative. FIG. 3G shows two possible solutions to the routing problem. That is, after picking up the two passenger groups for carpool, the simulated vehicle can either follow:

$D_0 \rightarrow O_1 \rightarrow O_2 \rightarrow D_1 \rightarrow D_2$ shown as Path I in FIG. 3G, or $D_0 \rightarrow O_1 \rightarrow O_2 \rightarrow D_2 \rightarrow D_1$ shown as Path II in FIG. 3G.

In Path I, $D_2$ is the final state of the simulated vehicle for the current state transition and is also the initial state for the next state transition. In Path II, $D_1$ is the final state of the simulated vehicle for the current state transition and is also the initial state for the next state transition.

Referring back to lines 17-24 of Algorithm 3 and Algorithm 4, a second transportation task with the minimum sum of total extra passenger travel time can be assigned to the simulated vehicle. In some embodiments, to choose among the paths, an extra passenger travel time $Ext_P(x, y)$ traveled by a vehicle going from x to y when a path P is chosen can be defined. The extra travel time $Ext_P(. , . )$ is an estimation of extra time each passenger group would have spent during carpool which otherwise is zero if no carpool is taken. For instance, in FIG. 3G the actual travel time without carpool for passenger group 1 picked up from $O_1$ is $t(O_1, D_1)$ and for passenger group 2 picked up from $O_2$ is $t(O_2, D_2)$ respectively. However, with carpool, the travel time for passenger group 1 picked up from $O_1$ is $t(O_1, O_2)+t_{Est}(O_2, D_1)$, and for passenger group 2 picked up from $O_2$ is $t_{Est}(O_2, D_1)+t_{Est}(D_1, D_2)$. The estimated travel time $t_{Est}(. , . )$ can be the output of a prediction algorithm, an example of which is discussed in the following reference incorporated herein by reference in its entirety: I. Jindal, Tony, Qin, X. Chen, M. Nokleby, and J. Ye., A Unified Neural Network Approach for Estimating Travel Time and Distance for a Taxi Trip, ArXiv e-prints, October 2017.

Referring back to FIG. 3E, Algorithm 4 shows how to obtain the extra passenger travel time for both paths. When Take-1 action is assigned, the extra passenger travel time is always zero, but here a Take-2 action is assigned. Accordingly, the extra travel time for passenger group 1, when Path I is followed, is:

$Ext_I(O_1,D_1)=t(O_1,O_2)+t_{Est}(O_2,D_1)-t(O_1,D_1)$

The extra travel time for passenger group 2, when Path I is followed, is:

$Ext_I(O_2,D_2)=t_{Est}(O_2,D_1)+t_{Est}(D_1,D_2)-t(O_2,D_2)$

The extra travel time for passenger group 1, when Path II is followed, is:

$Ext_{II}(O_1,D_1)=t(O_1,O_2)+t(O_2,D_2)+t_{Est}(O_2,D_1)-t(O_1,D_1)$

The extra travel time for passenger group 2, when Path II is followed, is:

$Ext_{II}(O_2,D_2)=t(O_2,D_2)-t(O_2,D_2)=0$

From the individual extra travel time for the on-board passenger groups for both the paths, the total extra passenger travel time can be obtained for each path. That is, for Path I, $Total_{ExtI}=T_{ExtI}=Ext_I(O_1, D_1)+Ext_I(O_2, D_2)$. For Path II, $Total_{ExtII}=T_{ExtII}=Ext_{II}(O_1, D_1)+Ext_{II}(O_2, D_2)$. Thus, referring to lines 20-23 of Algorithm 3, to minimize extra time cost to passengers, the simulated vehicle can choose Path I if $Total_{ExtI}<Total_{ExtII}$ and otherwise follow Path II.

After the transition is completed (at $T_1$ in FIG. 3F), the environment may compute the reward for this transition. Referring to line 24 of Algorithm 3, the reward can be based on the effective trip distance fulfilled by the carpooling trip, and by the sum of the original individual trip distances $d(O_1, D_1)+d(O_2, D_2)$. The agent is then ready to execute a new action of the action set described above. Similarly, Take-3 Action, Take-4 Action, or any Take-M action as long as consistent with the vehicle capacity can be similarly derived.

Thus, in some embodiments, the method for providing vehicle navigation simulation environment may further comprise: in response to finding the one or more second historical passenger groups satisfying the (condition C) and (condition D), assigning the simulated vehicle to transport passenger group Q, wherein: the passenger group Q is one of the found second historical passenger groups; transporting the passenger groups P and Q takes the least sum of: a total extra passenger travel time for (routing option 1) and a total extra passenger travel time for (routing option 2); the (routing option 1) comprises picking up the passenger group Q, then dropping of the passenger group P, and then dropping of the passenger group Q; the (routing option 2) comprises picking up the passenger group Q, then dropping of the passenger group Q, and then dropping of the passenger group P; the total extra passenger travel time for the (routing option 1) is a summation of extra time costing the passenger groups P and Q when transported by the simulated vehicle following the (routing option 1) as compared to being transported one-group-by-one-group without carpool; and the total extra passenger travel time for the (routing option 2) is a summation of extra time costing the passenger groups P and Q when transported by the simulated vehicle following the (routing option 2) as compared to being transported one-group-by-one-group without carpool.

In some embodiments, the method for providing vehicle navigation simulation environment may further comprise: if the total extra passenger travel time for the (routing option 1) is less than the total extra passenger travel time for the (routing option 2), assigning the simulated vehicle to follow the (routing option 1); and if the total extra passenger travel time for the (routing option 1) is more than the total extra passenger travel time for the (routing option 2), assigning the simulated vehicle to follow the (routing option 2).

As such, the disclosed environment can be used to train models and/or algorithms for vehicle navigation. Existing technologies have not developed such systems and methods that can provide a robust mechanism for training policies for vehicle services. The environment is a key for providing optimized policies that can guide vehicle driver effortlessly while maximizing their gain and minimizing passenger time cost. That is, the above-described recursive performance of the steps (1)-(4) based on historical data of trips taken by historical passenger groups can train a policy that maximizes a cumulative reward for the time period; and the trained policy determines an action for a real vehicle in a real environment when the real vehicle has no passenger, the action for the real vehicle in the real environment being selected from: (action 1) waiting at a current location of the real vehicle, and (action 2) determining the value M to transport M real passenger groups each comprising one or more passengers. For the real vehicle in the real environment, the (action 2) may further comprise: determining the M real passenger groups from available real passenger groups requesting vehicle service; if M is more than 1, determining an order for: picking up each of the M real passenger groups and dropping off each of the M passenger groups; and transporting the determined M real passenger groups according to the determined order. Therefore, the provided simulation environment paves the way for generating automatic vehicle guidance that makes passenger-picking or waiting decisions as well as carpool routing decisions for real vehicle drivers, which are unattainable by existing technologies.

FIG. 4A illustrates a flowchart of an exemplary method 400 for providing vehicle navigation simulation environment, according to various embodiments of the present disclosure. The exemplary method 400 may be implemented in various environments including, for example, the environment 100 of FIG. 1. The exemplary method 400 may be implemented by one or more components of the system 102a (e.g., the processor 104a, the memory 106a). The exemplary method 400 may be implemented by multiple systems similar to the system 102a. The operations of method 400 presented below are intended to be illustrative. Depending on the implementation, the exemplary method 400 may include additional, fewer, or alternative steps performed in various orders or in parallel.

The exemplary method 400 may comprise recursively performing steps (1)-(4) for a time period (e.g., a day). At block 401, step (1) may comprise providing one or more states of a simulation environment to a simulated agent. The simulated agent comprises a simulated vehicle, and the states comprise a first current time and a first current location of the simulated vehicle. At block 402, step (2) may comprise obtaining an action by the simulated vehicle when the simulated vehicle has no passenger. The action is selected from: waiting at the first current location of the simulated vehicle, and transporting M passenger groups. Each of the M passenger groups comprises one or more passengers. Every two groups of the M passenger groups have at least one of: different pick-up locations or different drop-off locations. At block 403, step (3) may comprise determining a reward to the simulated vehicle for the action. At block 404, step (4) may comprise updating the one or more states based on the action to obtain one or more updated states for providing to the simulated vehicle. The updated states comprise a second current time and a second current location of the simulated vehicle.

In some embodiments, the exemplary method 400 may be executed to obtain a simulator/simulation environment for training an algorithm or a model as described above. For example, the training may intake historical trip data to obtain a policy that maximizes a cumulative reward over the time period. The historical data may include details of historical passenger trips such as historical time points and locations of pick-ups and drop-offs.

Accordingly, the trained policy can be implemented on various computing devices to help service vehicle drivers to maximize their reward when they work on the streets. For example, a service vehicle driver may install a software application on a mobile phone and use the application to access the vehicle platform to receive business. The trained policy can be implemented in the application to recommend the driver to take a reward-optimizing action. For example, when the vehicle has no passenger onboard, the trained policy as executed may provide a recommendation such as: (1) waiting at the current position, (2) picking up 1 passenger group, (3) picking up 2 passenger groups, (3) picking up 3 passenger groups, etc. Each passenger group includes one or more passengers. The passenger groups to be picked up have already requested the transportations from the vehicle platform, and their requested pick-up locations are known to the application. The details for determining the recommendation are described below with reference to FIG. 4B.

Figure 4B:
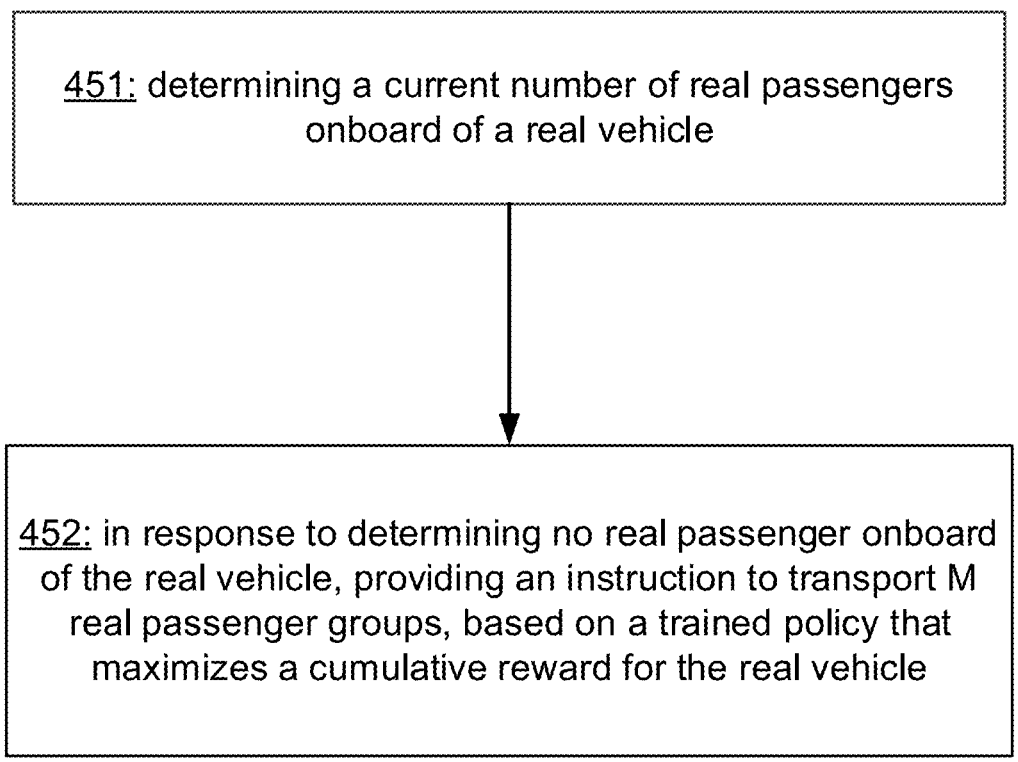
FIG. 4B illustrates a flowchart of an exemplary method for providing vehicle navigation, in accordance with various embodiments.

FIG. 4B illustrates a flowchart of an exemplary method 450 for providing vehicle navigation, according to various embodiments of the present disclosure. The exemplary method 450 may be implemented in various environments including, for example, the environment 200 of FIG. 2. The exemplary method 450 may be implemented by one or more components of the system 102b (e.g., the processor 104b, the memory 106b) or the computing device 110. For example, the method 450 may be executed by a server to provide instructions to the computing device 110 (e.g., a mobile phone used by a vehicle driver). The method 450 may be implemented by multiple systems similar to the system 102b. For another example, the method 450 may be executed by the computing device 110. The operations of method 450 presented below are intended to be illustrative. Depending on the implementation, the exemplary method 450 may include additional, fewer, or alternative steps performed in various orders or in parallel.

At block 451, a current number of real passengers onboard of a real vehicle may be determined. In one example, this step may be triggered when a vehicle driver activates a corresponding function from an application. In another example, this step may be performed constantly by the application. Since the vehicle driver relies on the application to interact with the vehicle platform, the application keeps track if current transportation tasks have been completed. If all tasks have been completed, the application can determine that no passenger is onboard. At block 452, in response to determining no real passenger onboard of the real vehicle, providing an instruction to transport M real passenger groups, based at least on a trained policy that maximizes a cumulative reward for the real vehicle. The training of the policy is described above with reference to FIG. 1, FIGS. 3A-3G, and FIG. 4A. Each of the M passenger groups may comprise one or more passengers. Every two groups of the M passenger groups may have at least one of: different pick-up locations or different drop-off locations. The real vehicle is at a first current location. For M=0, the instruction may comprise waiting at the first current location. For M=1, the instruction may comprise transporting passenger group R. For M=2, the instruction may comprise transporting passenger groups R and S in carpool. The passenger group R's pick-up location may take the least time to reach from the first current location. Transporting the passenger groups R and S in carpool may be associated with a least sum value of: a total extra passenger travel time for (routing option 1) and a total extra passenger travel time for (routing option 2). The (routing option 1) may comprise picking up the passenger group S, then dropping of the passenger group R, and then dropping of the passenger group S. The (routing option 2) may comprise picking up the passenger group S, then dropping of the passenger group S, and then dropping of the passenger group R. The total extra passenger travel time for the (routing option 1) may be a summation of extra time costing the passenger groups R and S when transported by the real vehicle following the (routing option 1) as compared to being transported group-by-group without carpool. The total extra passenger travel time for the (routing option 2) may be a summation of extra time costing the passenger groups R and S when transported by the real vehicle following the (routing option 2) as compared to being transported group-by-group without carpool.

In some embodiments, if the total extra passenger travel time for the (routing option 1) is less than the total extra passenger travel time for the (routing option 2), the instruction may comprise following the (routing option 1). If the total extra passenger travel time for the (routing option 1) is more than the total extra passenger travel time for the (routing option 2), the instruction may comprise following the (routing option 2).

In some embodiments, the trained policy can determine the M for providing the instruction when the vehicle has no passenger. Having determined M=1, the trained policy may automatically determine the passenger group R from current users requesting vehicle service. Having determined M=2, the trained policy may automatically determine the passenger groups R and S from current users requesting vehicle service, and determine the optimized routing option as described above. Similarly, the trained policy may determine passenger groups and routing options for M=3, M=4, etc. For each of the determination, the trained policy may maximize the reward to the vehicle driver, minimize the time cost to the passengers, maximize the efficiency of the vehicle platform, maximize the efficiency of the vehicle service, and/or optimize other parameters according to the training. Alternatively, the trained policy may determine the M, and the passenger group determination and/or the routing determination may be performed by algorithms (e.g., algorithms similar to Algorithms 2 to 4 and installed in a computing device or installed in a server coupled to the computing device).

Accordingly, the vehicle driver can rely on policy and/or algorithm determinations to perform the vehicle service in an efficient manner, with maximization of her gain and/or minimization of passengers' time costs. The vehicle service may involve single passenger/passenger group trip and/or multi passenger/passenger group carpooling trips. The optimization result achieved by the disclosed systems and methods are not attainable by existing systems and methods. Currently, a vehicle driver even if provided with a location map of current vehicle services requests would not be able to determine the best move that brings more reward than other choices. The existing systems and methods cannot weigh between waiting and picking up passengers, cannot determine which passenger to pick up, and cannot determine the best route for carpooling trips. Therefore, the disclosed systems and methods at least mitigate or overcome such challenges in providing vehicle service and providing navigation.

The techniques described herein are implemented by one or more special-purpose computing devices. The special-purpose computing devices may be hard-wired to perform the techniques, or may include circuitry or digital electronic devices such as one or more application-specific integrated circuits (ASICs) or field programmable gate arrays (FPGAs) that are persistently programmed to perform the techniques, or may include one or more hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, server computer systems, portable computer systems, handheld devices, networking devices or any other device or combination of devices that incorporate hard-wired and/or program logic to implement the techniques. Computing device(s) are generally controlled and coordinated by operating system software. Conventional operating systems control and schedule computer processes for execution, perform memory management, provide file system, networking, I/O services, and provide a user interface functionality, such as a graphical user interface ("GUI"), among other things.

Figure 5:
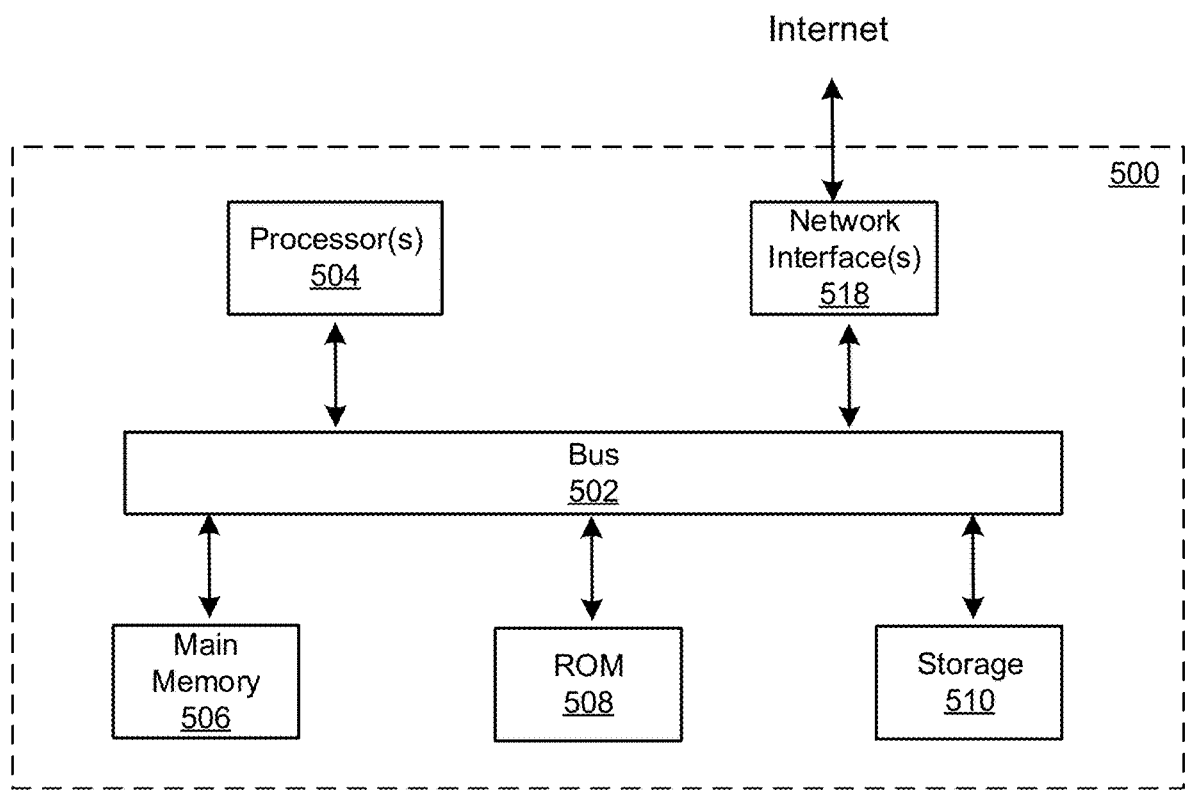
FIG. 5 illustrates a block diagram of an example computer system in which any of the embodiments described herein may be implemented.

FIG. 5 is a block diagram that illustrates a computer system 500 upon which any of the embodiments described herein may be implemented. The system 500 may correspond to the system 102a or 102b described above. The computer system 500 includes a bus 502 or other communication mechanism for communicating information, one or more hardware processors 504 coupled with bus 502 for processing information. Hardware processor(s) 504 may be, for example, one or more general purpose microprocessors. The processor(s) 504 may correspond to the processor 104a or 104b described above.

The computer system 500 also includes a main memory 506, such as a random access memory (RAM), cache and/or other dynamic storage devices, coupled to bus 502 for storing information and instructions to be executed by processor 504. Main memory 506 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions. The computer system 500 further includes a read only memory (ROM) 508 or other static storage device coupled to bus 502 for storing static information and instructions for processor 504. A storage device 510, such as a magnetic disk, optical disk, or USB thumb drive (Flash drive), etc., is provided and coupled to bus 502 for storing information and instructions. The main memory 506, the ROM 508, and/or the storage 510 may correspond to the memory 106a or 106b described above.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 506. Such instructions may be read into main memory 506 from another storage medium, such as storage device 510. Execution of the sequences of instructions contained in main memory 506 causes processor(s) 504 to perform the process steps described herein. In alternative embodiments, hardwired circuitry may be used in place of or in combination with software instructions.

The main memory 506, the ROM 508, and/or the storage 510 may include non-transitory storage media. The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 510. Volatile media includes dynamic memory, such as main memory 506. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

The computer system 500 also includes a communication interface 518 coupled to bus 502. Communication interface 518 provides a two-way data communication coupling to one or more network links that are connected to one or more local networks. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN (or WAN component to communicated with a WAN). Wireless links may also be implemented. In any such implementation, communication interface 518 sends and receives electrical, electromagnetic or optical signals that carry digital data streams representing various types of information.

The computer system 500 can send messages and receive data, including program code, through the network(s), network link and communication interface 518. In the Internet example, a server might transmit a requested code for an application program through the Internet, the ISP, the local network and the communication interface 518.

The received code may be executed by processor 504 as it is received, and/or stored in storage device 510, or other non-volatile storage for later execution.

Each of the processes, methods, and algorithms described in the preceding sections may be embodied in, and fully or partially automated by, code modules executed by one or more computer systems or computer processors comprising computer hardware. The processes and algorithms may be implemented partially or wholly in application-specific circuitry.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the subject matter has been described with reference to specific example embodiments, various modifications and changes may be made to these embodiments without departing from the broader scope of embodiments of the present disclosure. Such embodiments of the subject matter may be referred to herein, individually or collectively, by the term "invention" merely for convenience and without intending to voluntarily limit the scope of this application to any single disclosure or concept if more than one is, in fact, disclosed.

The Detailed Description is not to be taken in a limiting sense, and the scope of various embodiments is defined only by the appended claims, along with the full range of equivalents to which such claims are entitled.

The invention claimed is:

1. A method for providing vehicle navigation simulation environment, comprising recursively performing steps for a time period:
    (1) providing one or more states of a simulation environment to a simulated agent, wherein: the simulated agent comprises a simulated vehicle, and the states comprise a first current time and a first current location of the simulated vehicle;
    (2) obtaining an action by the simulated vehicle when the simulated vehicle has no passenger, wherein: the action is selected from: waiting at the first current location of the simulated vehicle, and transporting M passenger groups, each of the M passenger groups comprises one or more passengers, and every two groups of the M passenger groups have at least one of: different pick-up locations or different drop-off locations;
    (3) determining a reward to the simulated vehicle for the action; and
    (4) updating the one or more states based on the action to obtain one or more updated states for providing to the simulated vehicle, wherein: the updated states comprise a second current time and a second current location of the simulated vehicle;
    wherein: recursively performing steps (1)-(4) using a plurality of algorithms each describing a specific action to take based on historical data of trips taken by historical passenger groups trains a policy that maximizes a cumulative reward for the time period; and the trained policy determines an action for a real vehicle in a real environment when the real vehicle has no passenger, the action for the real vehicle in the real environment being selected from: waiting at a current location of the real vehicle, and determining the value M to transport M real passenger groups each comprising one or more passengers, wherein, for the real vehicle in the real environment, the determining of the value M further comprises: determining the M real passenger groups from available real passenger groups requesting vehicle service; if M is more than 1, determining an order for: picking up each of the M real passenger groups and dropping off each of the M passenger groups; and transporting the determined M real passenger groups according to the determined order.

2. The method of claim 1, wherein:
obtaining the action by the simulated vehicle when the simulated vehicle has no passenger comprises obtaining the action by the simulated vehicle only when the simulated vehicle has no passenger; and
the simulated vehicle performs the action for the each recursion.

3. The method of claim 1, wherein:
if the action is waiting at the current location of the simulated vehicle, the second current time is a current time corresponding to the first current time plus a time segment, and the second current location is the same as the first current location; and
if the action is transporting the M passenger groups, the second current time is a current time corresponding to having dropped off all of the M passenger groups and the second current location is a current location of the vehicle at the second current time.

4. The method of claim 3, further comprising, based on historical data of trips taken by historical passenger groups: searching for one or more first historical passenger groups, wherein: a first condition in which time points when the first historical passenger groups were respectively picked up from first pick-up locations are within a first time threshold from the first current time, and a second condition in which time points for the simulated vehicle to reach the first pick-up locations from the first current location are respectively no later than historical time points when the first passenger groups were picked up; and in response to finding no first historical passenger group satisfying the first condition and the second condition, assigning the simulated vehicle to wait at the first current location, and correspondingly determining the reward for the current action to be zero.

5. The method of claim 4, further comprising: if M=1 and in response to finding one or more first historical passenger groups satisfying the first condition and the second condition, assigning the simulated vehicle to transport passenger group P associated with a first pick-up location that takes the least time to reach from the first current location, and correspondingly determining the reward for the current action based on a travel distance by the passenger group P for the assigned transportation, wherein the passenger group P is one of the found first historical passenger groups.

6. The method of claim 4, further comprising: if M=2 and in response to finding the one or more first historical passenger groups satisfying the first condition and the second condition, assigning the simulated vehicle to pick up passenger group P associated with a first pick-up location that takes the least time to reach from the first current location, wherein the passenger group P is one of the found first historical passenger groups; determining a time T for transporting the passenger group P from the first pick-up location to a destination of the passenger group P; searching for one or more second historical passenger groups, wherein: a third condition in which time points when the second historical passenger groups were respectively picked up from second pick-up locations are within a second time threshold from time point when the passenger group P was picked up, the second time threshold being a portion of the determined time T, and a fourth condition in which time points for the simulated vehicle to reach the second pick-up locations from the time when the passenger group P was picked up are respectively no later than historical time points when the second historical passenger groups were picked up; and in response to finding no second historical passenger group satisfying the third condition and the fourth condition, assigning the simulated vehicle to wait at the first pick-up location of the passenger group P.

7. The method of claim 5, further comprising: in response to finding the one or more second historical passenger groups satisfying the third condition and the fourth condition, assigning the simulated vehicle to transport passenger group Q, wherein: the passenger group Q is one of the found second historical passenger groups; transporting the passenger groups P and Q takes the least sum of: a total extra passenger travel time for a first routing option and a total extra passenger travel time for a second routing option; the first routing option comprises picking up the passenger group Q, then dropping of the passenger group P, and then dropping of the passenger group Q; the second routing option comprises picking up the passenger group Q, then dropping of the passenger group Q, and then dropping of the passenger group P; the total extra passenger travel time for the first routing option is a summation of extra time costing the passenger groups P and Q when transported by the simulated vehicle following the second routing option as compared to being transported one-group-by-one-group without carpool; and the total extra passenger travel time for the second routing option is a summation of extra time costing the passenger groups P and Q when transported by the simulated vehicle following the second routing option as compared to being transported one-group-by-one-group without carpool.

8. The method of claim 7, further comprising: if the total extra passenger travel time for the first routing option is less than the total extra passenger travel time for the second routing option, assigning the simulated vehicle to follow the first routing option; and if the total extra passenger travel time for the first routing option is more than the total extra passenger travel time for the second routing option, assigning the simulated vehicle to follow the second routing option.

9. A non-transitory computer-readable storage medium storing instructions that, when executed by one or more processors, cause the one or more processors to perform a method for providing vehicle navigation simulation environment, the method comprising recursively performing steps for a time period:
(1) providing one or more states of a simulation environment to a simulated agent, wherein: the simulated agent comprises a simulated vehicle, and the states comprise a first current time and a first current location of the simulated vehicle;
(2) obtaining an action by the simulated vehicle when the simulated vehicle has no passenger, wherein: the action is selected from: waiting at the first current location of the simulated vehicle, and transporting M passenger groups, each of the M passenger groups comprises one or more passengers, and every two groups of the M passenger groups have at least one of: different pick-up locations or different drop-off locations;
(3) determining a reward to the simulated vehicle for the action; and
(4) updating the one or more states based on the action to obtain one or more updated states for providing to the simulated vehicle, wherein: the updated states comprise a second current time and a second current location of the simulated vehicle;
wherein: recursively performing steps (1)-(4) using a plurality of algorithms each describing a specific action to take based on historical data of trips taken by historical passenger groups trains a policy that maximizes a cumulative reward for the time period; and the trained policy determines an action for a real vehicle in a real environment when the real vehicle has no passenger, the action for the real vehicle in the real environment being selected from: waiting at a current location of the real vehicle, and determining the value M to transport M real passenger groups each comprising one or more passengers, wherein, for the real vehicle in the real environment, the determining of the value M further comprises: determining the M real passenger groups from available real passenger groups requesting vehicle service; if M is more than 1, determining an order for: picking up each of the M real passenger groups and dropping off each of the M passenger groups; and transporting the determined M real passenger groups according to the determined order.

10. The non-transitory computer-readable storage medium of claim 9, wherein:
obtaining the action by the simulated vehicle when the simulated vehicle has no passenger comprises obtaining the action by the simulated vehicle only when the simulated vehicle has no passenger; and
the simulated vehicle performs the action for the each recursion.

11. The non-transitory computer-readable storage medium of claim 9, wherein:
if the action is waiting at the current location of the simulated vehicle, the second current time is a current time corresponding to the first current time plus a time segment, and the second current location is the same as the first current location; and
if the action is transporting the M passenger groups, the second current time is a current time corresponding to having dropped off all of the M passenger groups and the second current location is a current location of the vehicle at the second current time.

12. The non-transitory computer-readable storage medium of claim 11, further comprising, based on historical data of trips taken by historical passenger groups: searching for one or more first historical passenger groups, wherein: a first condition in which time points when the first historical passenger groups were respectively picked up from first pick-up locations are within a first time threshold from the first current time, and a second condition in which time points for the simulated vehicle to reach the first pick-up locations from the first current location are respectively no later than historical time points when the first passenger groups were picked up; and in response to finding no first historical passenger group satisfying the first condition and the second condition, assigning the simulated vehicle to wait at the first current location, and correspondingly determining the reward for the current action to be zero.

13. The non-transitory computer-readable storage medium of claim 12, further comprising: if M=1 and in response to finding one or more first historical passenger groups satisfying the first condition and the second condition, assigning the simulated vehicle to transport passenger group P associated with a first pick-up location that takes the least time to reach from the first current location, and correspondingly determining the reward for the current action based on a travel distance by the passenger group P for the assigned transportation, wherein the passenger group P is one of the found first historical passenger groups.

14. The non-transitory computer-readable storage medium of claim 12, further comprising: if M=2 and in response to finding the one or more first historical passenger groups satisfying the first condition and the second condition, assigning the simulated vehicle to pick up passenger group P associated with a first pick-up location that takes the least time to reach from the first current location, wherein the passenger group P is one of the found first historical passenger groups; determining a time T for transporting the passenger group P from the first pick-up location to a destination of the passenger group P; searching for one or more second historical passenger groups, wherein: a third condition time points when the second historical passenger groups were respectively picked up from second pick-up locations are within a second time threshold from time point when the passenger group P was picked up, the second time threshold being a portion of the determined time T, and a fourth condition time points for the simulated vehicle to reach the second pick-up locations from the time when the passenger group P was picked up are respectively no later than historical time points when the second historical passenger groups were picked up; and in response to finding no second historical passenger group satisfying the third condition and the fourth condition, assigning the simulated vehicle to wait at the first pick-up location of the passenger group P.

15. The non-transitory computer-readable storage medium of claim 13, further comprising: in response to finding the one or more second historical passenger groups satisfying the third condition and the fourth condition, assigning the simulated vehicle to transport passenger group Q, wherein: the passenger group Q is one of the found second historical passenger groups; transporting the passenger groups P and Q takes the least sum of: a total extra passenger travel time for a first routing option and a total extra passenger travel time for a second routing option; the first routing option comprises picking up the passenger group Q, then dropping of the passenger group P, and then dropping of the passenger group Q; the second routing option comprises picking up the passenger group Q, then dropping of the passenger group Q, and then dropping of the passenger group P; the total extra passenger travel time for the first routing option is a summation of extra time costing the passenger groups P and Q when transported by the simulated vehicle following the first routing option as compared to being transported one-group-by-one-group without carpool; and the total extra passenger travel time for the second routing option is a summation of extra time costing the passenger groups P and Q when transported by the simulated vehicle following the second routing option as compared to being transported one-group-by-one-group without carpool.

16. The non-transitory computer-readable storage medium of claim 15, further comprising: if the total extra passenger travel time for the first routing option is less than the total extra passenger travel time for the second routing option, assigning the simulated vehicle to follow the first routing option; and if the total extra passenger travel time for the first routing option is more than the total extra passenger travel time for the second routing option, assigning the simulated vehicle to follow the second routing option.

* * * * *